(12) United States Patent
Noguchi et al.

(10) Patent No.: US 11,317,513 B2
(45) Date of Patent: Apr. 26, 2022

(54) OPTICAL MODULE

(71) Applicant: CIG Photonics Japan Limited, Kanagawa (JP)

(72) Inventors: Daisuke Noguchi, Tachikawa (JP); Hiroshi Yamamoto, Inagi (JP)

(73) Assignee: CIG PHOTONICS JAPAN LIMITED, Sagamihara (JP)

( * ) Notice: Subject to any disclaimer, the term of this patent is extended or adjusted under 35 U.S.C. 154(b) by 0 days.

(21) Appl. No.: 17/113,414

(22) Filed: Dec. 7, 2020

(65) Prior Publication Data

US 2021/0195746 A1 Jun. 24, 2021

(30) Foreign Application Priority Data

Dec. 20, 2019 (JP) .............................. JP2019-230383

(51) Int. Cl.
| | |
|---|---|
| *H05K 7/00* | (2006.01) |
| *H05K 1/14* | (2006.01) |
| *H05K 1/11* | (2006.01) |
| *H05K 1/18* | (2006.01) |
| *H05K 3/28* | (2006.01) |

(52) U.S. Cl.
CPC .............. *H05K 1/147* (2013.01); *H05K 1/113* (2013.01); *H05K 1/118* (2013.01); *H05K 1/189* (2013.01); *H05K 3/28* (2013.01); *H05K 2201/10121* (2013.01)

(58) Field of Classification Search
CPC ........ H05K 1/147; H05K 1/113; H05K 1/118; H05K 1/189; H05K 3/28; H05K 2201/10121

USPC ......................................................... 361/749
See application file for complete search history.

(56) References Cited

U.S. PATENT DOCUMENTS

| | | | |
|---|---|---|---|
| 2005/0161587 A1* | 7/2005 | Mihara | ............... H01L 21/6836 250/214 R |
| 2005/0174190 A1 | 8/2005 | Yagyu et al. | |
| 2006/0082422 A1 | 4/2006 | Yagyu et al. | |
| 2007/0102830 A1* | 5/2007 | Muto | .................... H05K 1/0219 257/784 |
| 2016/0066425 A1 | 3/2016 | Iizaka | |
| 2016/0261074 A1* | 9/2016 | Fitzpatrick | ......... H01R 13/6467 |

(Continued)

FOREIGN PATENT DOCUMENTS

| | | | |
|---|---|---|---|
| JP | 2004-247980 A | | 9/2004 |
| JP | 2016020937 A | * | 2/2016 |
| JP | 2016-051770 A | | 4/2016 |

*Primary Examiner* — Andargie M Aychillhum
(74) *Attorney, Agent, or Firm* — Mattingly & Malur, PC

(57) ABSTRACT

An optical module includes a photoelectric device and a flexible printed circuit board. The flexible printed circuit board includes an insulating substrate with a first surface and a second surface, a first wiring pattern on the first surface, and a second wiring pattern on the second surface. The first wiring pattern includes a signal line with a signal terminal portion at a tip and a signal-line portion narrower than the signal terminal portion, the first wiring pattern including a pair of ground pads at positions sandwiching the signal-line portion, at least part of the pair of ground pads avoiding being adjacent to the signal terminal portion. The second wiring pattern includes a ground plane overlapping with the signal-line portion and being connected to the pair of ground pads, the second wiring pattern including a signal pad connected to the signal terminal portion.

9 Claims, 9 Drawing Sheets

(56) References Cited

U.S. PATENT DOCUMENTS

2017/0370569 A1* 12/2017 He ............... F21V 29/503
2018/0103549 A1    4/2018 Iizaka
2019/0146167 A1*  5/2019 Leigh ............ G02B 6/4246
                                                361/715

* cited by examiner

OPTICAL MODULE

CROSS-REFERENCE TO RELATED APPLICATION

The present application claims priority from Japanese patent application JP2019-230383 filed on Dec. 20, 2019, the contents of which are hereby incorporated by reference into this application.

BACKGROUND

1. Field

This relates to an optical module.

2. Description of the Related Art

A flexible printed circuit board (FPC) in an optical module has pads arranged in a horizontal row for electrical connection with the outside (JP 2016-51770A, JP 2004-247980A). For example, a pad for transmitting high frequency signals is in a position sandwiched between other pads for being connected to a ground pattern.

With the pads arranged in a horizontal row, the flexible printed circuit board is wider. Alternatively, with the pads being thinner, workability of soldering worsens, leading to uneven bonding, posing a problem of deterioration in frequency characteristics of the optical module.

SUMMARY

This aims at preventing deterioration of frequency characteristics.

(1) An optical module includes: a photoelectric device adapted to convert an optical signal and an electrical signal at least from one to another; and a flexible printed circuit board electrically connected to the photoelectric device. The flexible printed circuit board includes an insulating substrate with a first surface and a second surface, a first wiring pattern on the first surface, and a second wiring pattern on the second surface. The first wiring pattern includes a signal line with a signal terminal portion at a tip and a signal-line portion narrower than the signal terminal portion, the first wiring pattern including a pair of ground pads at positions sandwiching the signal-line portion, at least part of the pair of ground pads avoiding being adjacent to the signal terminal portion. The second wiring pattern includes a ground plane overlapping with the signal-line portion and being connected to the pair of ground pads, the second wiring pattern including a signal pad connected to the signal terminal portion.

This enables the ground pad to be close to the signal-line portion, thereby preventing deterioration of the frequency characteristics.

(2) In the optical module according to (1), the insulating substrate, in a planar shape, may have a first side extending in a first direction, and a pair of second sides extending from respective both ends of the first side and extending in a second direction intersecting with the first direction, the signal terminal portion may be at an end portion including the first side, the pair of ground pads may be at respective end portions including the pair of second sides.

(3) In the optical module according to (2), the signal terminal portion may have an edge that coincides with the first side, and the pair of ground pads may have edges that coincide with the respective pair of second sides.

(4) In the optical module according to (2) or (3), the insulating substrate, in the planar shape, may have a main body and at least one projection from the main body, and the at least one projection may have an outer shape composed of the first side and the pair of second sides.

(5) In the optical module according to (4), the first wiring pattern may further include a power supply line, and the second wiring pattern may further include a power supply pad connected to the power supply line.

(6) In the optical module according to (5), the power supply line may be positioned without being adjacent to the pair of ground pads in the first direction.

(7) In the optical module according to (6), the power supply line may be on the main body without being on the at least one projection.

(8) In the optical module according to any one of (4) to (7), the at least one protrusion may be some protrusions, and the insulating substrate may have a slit between each adjacent pair of the projections.

(9) The optical module according to any one of (1) to (8), may further include a printed circuit board with a circuit pattern connected to the ground plane and the signal pad with a conductive connecting material.

DETAILED DESCRIPTION

Figure 1:
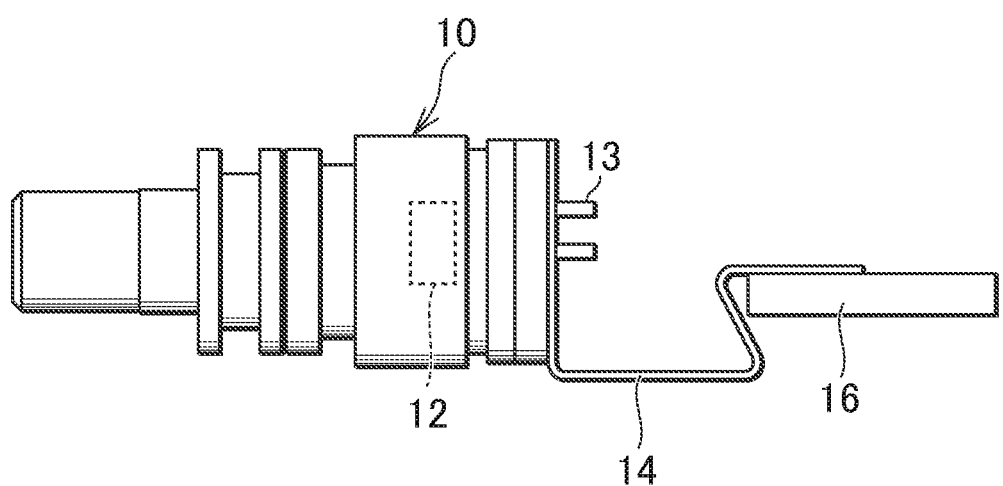
FIG. 1 is a perspective view of an optical module in a first embodiment.

Hereinafter, with reference to drawings, the embodiment of the present invention is described specifically and in detail. In all the drawings, the same members are denoted by the same reference numerals and have the same or equivalent functions, and a repetitive description thereof will be omitted. The size of the figure does not necessarily coincide with the magnification.

First Embodiment

FIG. 1 is a perspective view of an optical module according to a first embodiment. The optical module is a TO-CAN (Transistor Outline-Can) type optical module and has an optical subassembly 10. The optical subassembly 10 may be any of an optical transmission subassembly with a light emitting device (TOSA: Transmitter Optical Sub-Assembly), an optical reception subassembly with a light receiving device (ROSA: Receiver Optical Sub-Assembly), and a two-way module with both a light emitting device and a light receiving device (BOSA: Bidirectional Optical Sub-Assembly). The optical sub-assembly 10 includes a photoelectric device 12 for converting the optical signal and the electrical signal at least from one to another. The optical subassembly 10 has lead pins 13 for electrical connection between the photoelectric device 12 and the outside. A flexible printed circuit board (FPC) 14 is connected to the lead pins 13. The flexible printed circuit board 14 is connected to a printed circuit board (PCB) 16.

Figure 2:
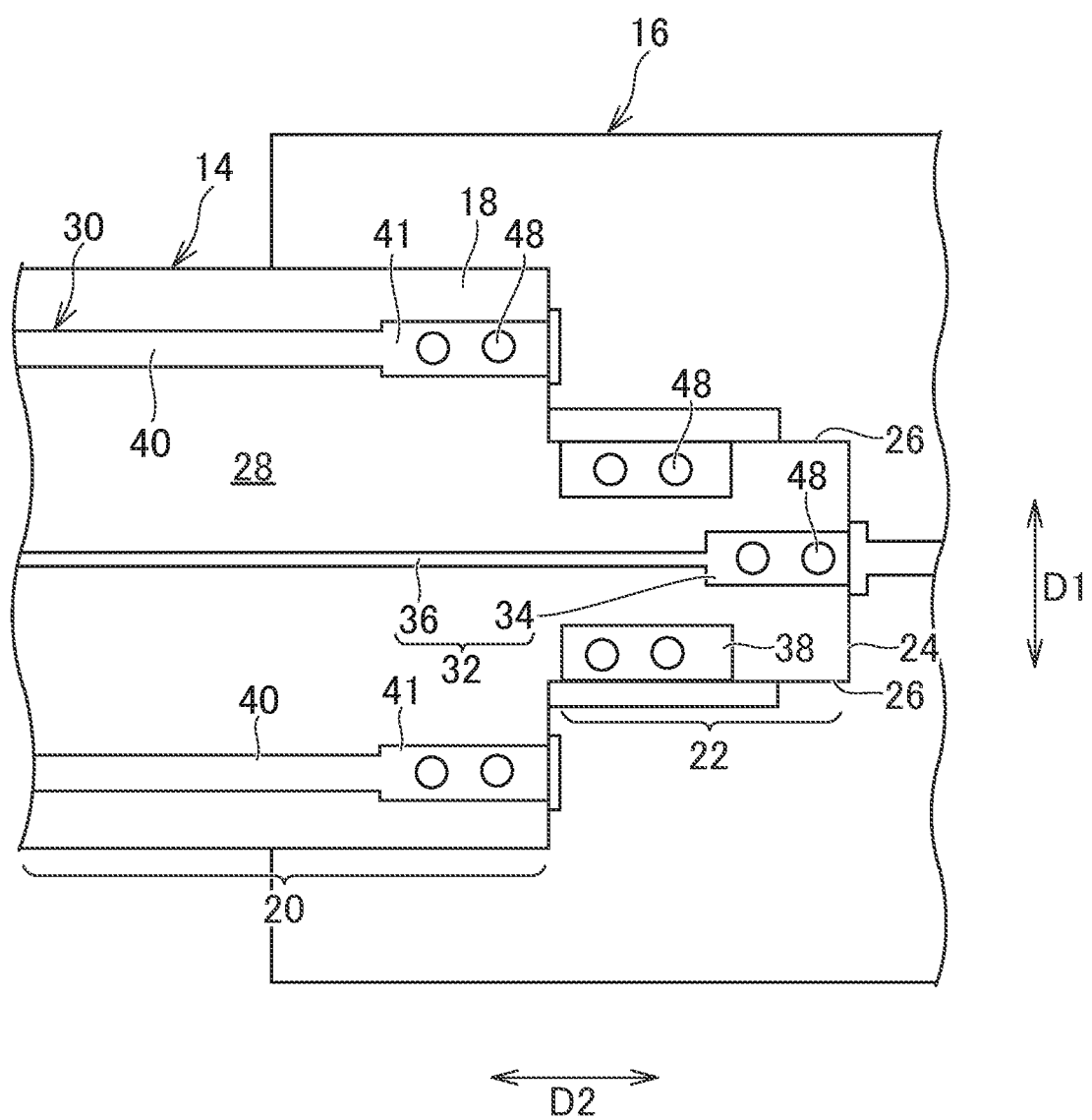
FIG. 2 is a plan view of connection of a flexible printed circuit board and a printed circuit board.

FIG. 2 is a plan view of connection of a flexible printed circuit board 14 and a printed circuit board 16. The flexible printed circuit board 14 has an insulating substrate 18 such as an insulating film. The insulating substrate 18, in a planar shape, has a main body 20 and at least one projection 22 from the main body 20. The main body 20 and the projection are, for example, rectangular. The outer shape of the projection 22 is composed of a first side 24 and a pair of second sides 26. The first side 24 extends in a first direction D1. The pair of second sides 26 extend from respective both ends of the first side 24 in a second direction D2 crossing the first direction D1. The insulating substrate 18 has a first surface 28.

The flexible printed circuit board 14 has a first wiring pattern 30 on the first surface 28. The first wiring pattern 30 includes a signal line 32 for transmitting high-frequency signals. The signal line 32 includes a signal terminal portion 34 at its tip. The signal terminal portion 34 is located at the end portion including the first side 24 (distal end portion of the projection 22). An edge of the signal terminal portion 34 coincides with the first side 24. The signal line 32 includes a signal-line portion 36 that is thinner than the signal terminal portion 34.

The first wiring pattern 30 includes a pair of ground pads 38. The pair of ground pads 38 are at positions sandwiching the signal-line portion 36. The distance between the pair of ground pads 38 is 3 mm or less. That is, the ground pads 38 are close to the signal-line portion 36. Thus, the return current flows, through the path close to the high-frequency signals, to the ground pads 38. The shortening of the path makes it possible to reduce the unnecessary radiation of the electro-magnetic field, stabilize the ground, and reduce the cross-talk. Incidentally, although the ground pads 38 are close to the signal-line portion 36, since the signal-line portion 36 is thin, it is possible to ensure the desired impedance without reducing the characteristic impedance.

The pair of ground pads 38 at least at its part avoid being adjacent to the signal terminal portion 34. For example, the pair of ground pads 38 are located at respective end portions including the pair of second sides 26 (side portions of the projection 22). The edges of the pair of ground pads 38 coincide with the respective pair of second sides 26.

The first wiring pattern 30 includes a power supply line 40 for the direct signal to be communicated (DC voltage to be applied). The power supply line 40 is positioned so as not to be adjacent to the pair of ground pads 38 in the first direction D1. The power supply line 40 is located on the main body 20 avoiding the projection 22. The power supply line 40 includes a power supply terminal portion 41 at its tip.

Figure 3:
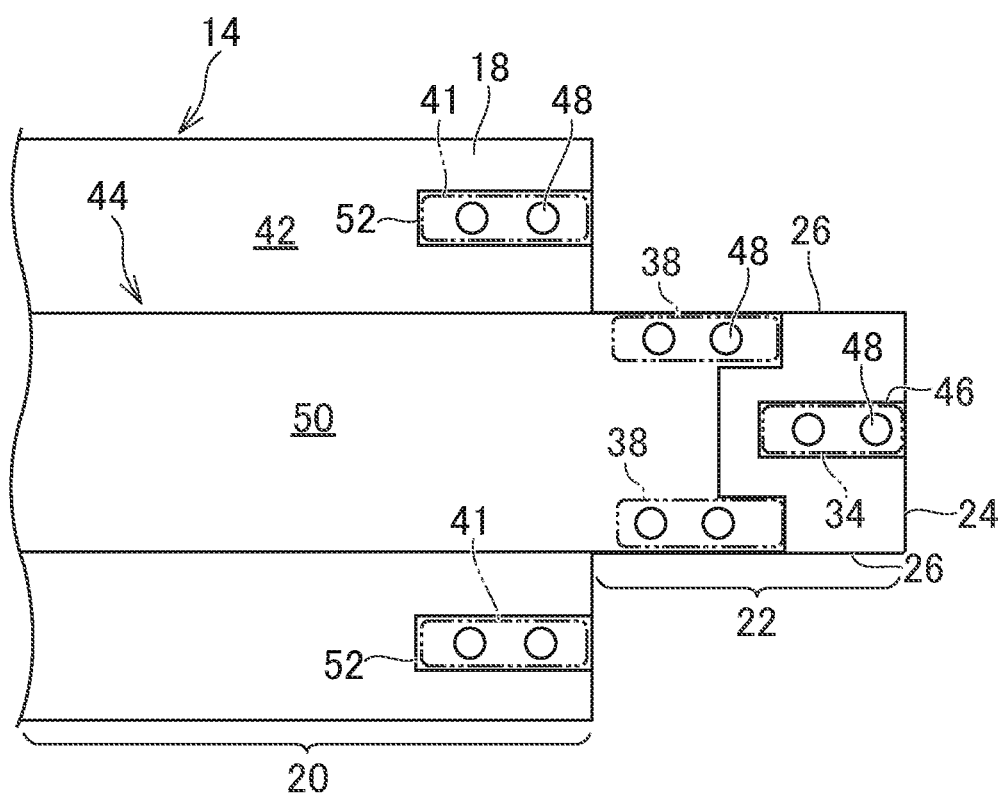
FIG. 3 is a plan view of the opposite side of the flexible printed circuit board in FIG. 2.

FIG. 3 is a plan view of the opposite side of the flexible printed circuit board 14 in FIG. 2. The insulating substrate 18 has a second surface 42. The flexible printed circuit board 14 has a second wiring pattern 44 on the second surface 42.

The second wiring pattern 44 includes a signal pad 46. The signal pad 46 is at a position overlapping with the signal terminal portion 34. That is, the signal pad 46 is also located at the end portion including the first side 24 (distal end portion of the projection 22); the edge of the signal pad 46 coincides with the first side 24. The signal pad 46 is connected to the signal terminal 34. A through hole 48 is used for the connection. The through hole 48 penetrates the insulating substrate 18, making it possible to visually perform alignment or confirm the junction.

The second wiring pattern 44 includes a ground plane 50. The ground plane 50 is at a position overlapping with the signal-line portion 36 shown in FIG. 2, constituting the microstrip line. The ground plane 50 is connected to the pair of ground pads 38. The through holes 48 are also used for this connection.

The second wiring pattern 44 includes a power supply pad 52. The power supply pad 52 is at a position overlapping the power supply terminal portion 41, and both are connected to each other. A through hole 48 is used for the connection. The power supply pad 52 is closer to the optical subassembly 10 (FIG. 1) than the signal pad 46. Since the power supply pads 52 are away from the signal pads 46, the reduction effect of the high frequency signal component which is overlayed on the direct signal is large.

Figure 4:
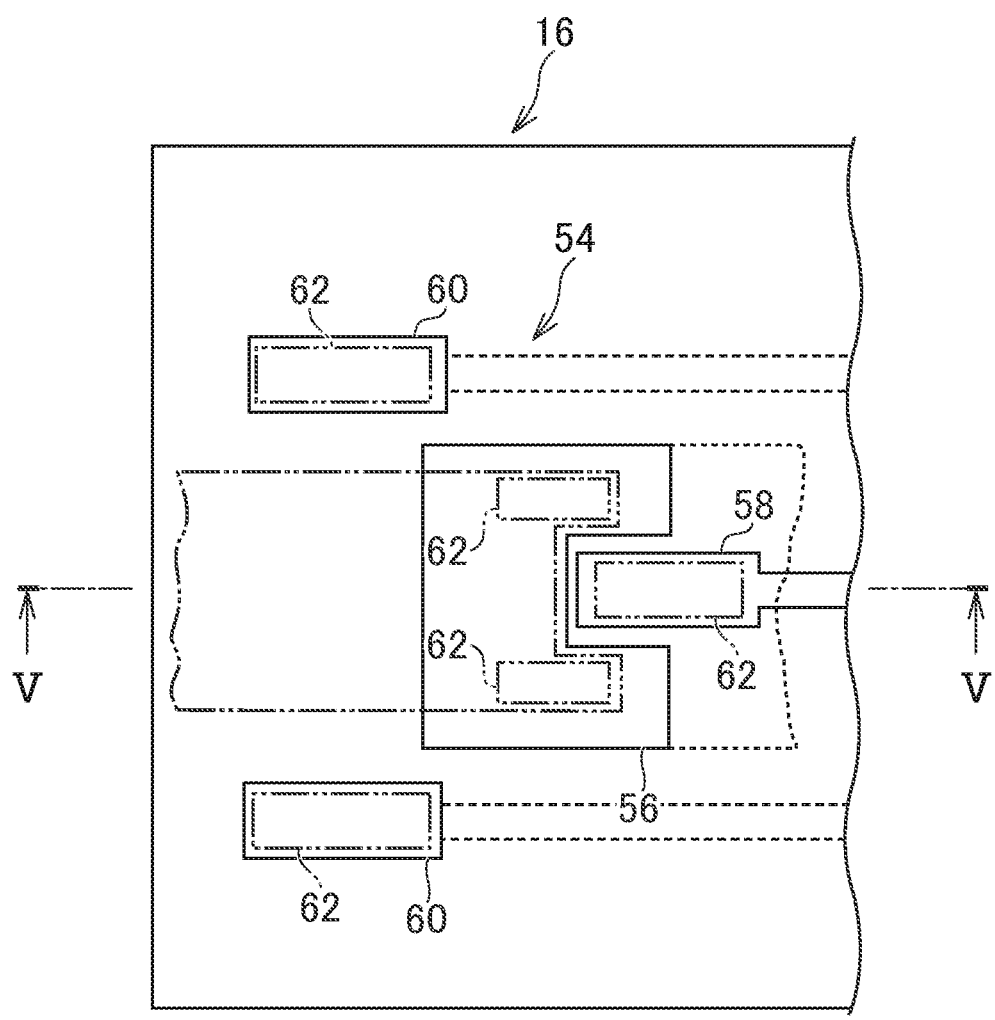
FIG. 4 is a plan view of the printed circuit board in FIG. 2.
Figure 5:
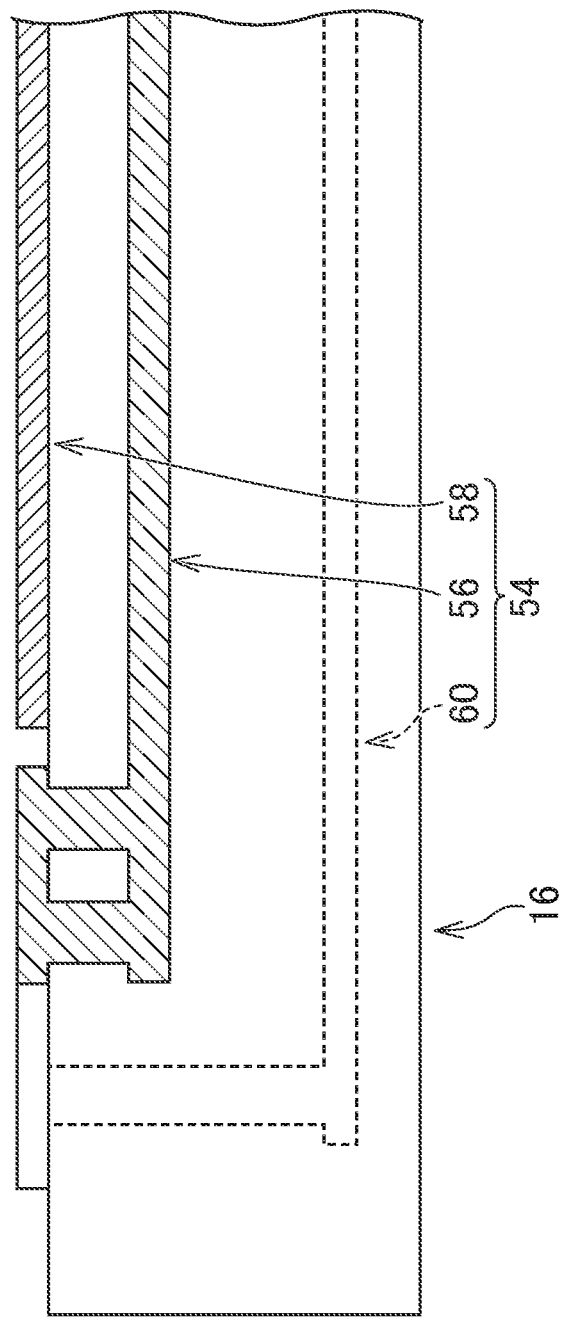
FIG. 5 is a V-V line sectional view of the printed circuit board in FIG. 4.

FIG. 4 is a plan view of the printed circuit board 16 in FIG. 2. FIG. 5 is a V-V line sectional view of the printed circuit board 16 in FIG. 4. The optical module has the printed circuit board 16. The printed circuit board 16 includes a circuit pattern to enable high-density mounting. The circuit pattern 54 includes a ground line structure 56, a high-frequency signal line structure 58, and a direct-current signal line structure 60, each of which has multiple layers.

The flexible printed circuit board 14 and the printed circuit board 16 are electrically connected to each other, with a conductive connecting material 62. The connection by the conductive connecting material 62 is, as shown in FIG. 4, an electrical connection method by interposing a conductive connecting material 62 (e.g., solder, brazing material, conductive adhesive). For example, the ground plane 50 shown in FIG. 3 (portion overlapping with the ground pad 38), is bonded to the ground line structure 56. The signal pad 46 shown in FIG. 3 is bonded to the high-frequency signal line structure 58. Part of the ground plane 50 shown in FIG. 3 (part overlapping with the ground pads 38) is shifted from the position of the signal pad 46, it is excellent in workability of soldering. In addition, the power supply pads 52 are joined to the direct-current signal line structure 60.

As shown in FIG. 2, there is no interconnecting line of the flexible printed circuit board 14 outside the ground pad 38. Therefore, it is possible to widen the ground line structure 56 of the printed circuit board 16, place many vias for interlayer connection, and provide electrically firm connection of the multiply-layered ground line structure 56.

Figure 6:
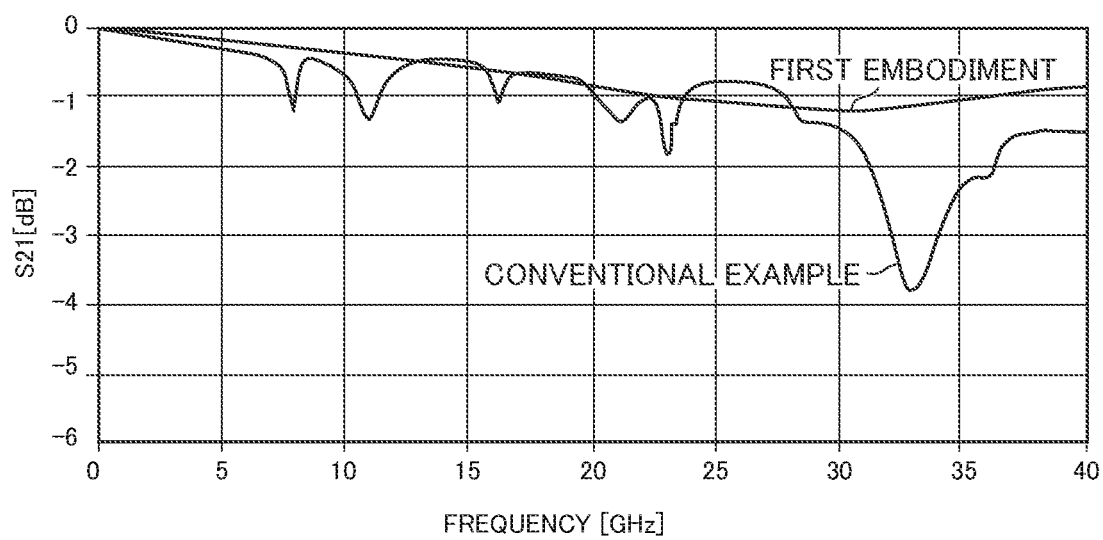
FIG. 6 is a diagram of frequency characteristics, in a conventional example and the first embodiment, obtained by simulation using the three-dimensional electric field analysis tool.

FIG. 6 is a diagram of frequency characteristics, in a conventional example and the first embodiment, obtained by simulation using the three-dimensional electric field analysis tool. In the conventional example, the pads on the flexible printed circuit board are arranged in a horizontal row. As compared with the conventional example, the transmission characteristics S21 of the first embodiment is apparently improved.

Second Embodiment

Figure 7:
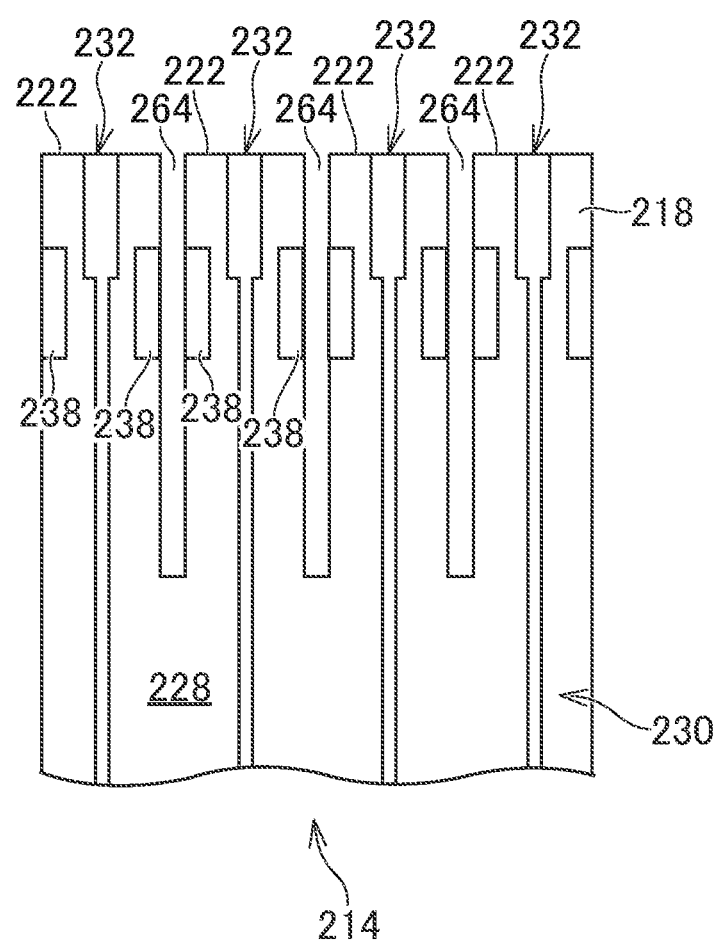
FIG. 7 is a plan view of a first surface of a flexible printed circuit board in a second embodiment.
Figure 8:
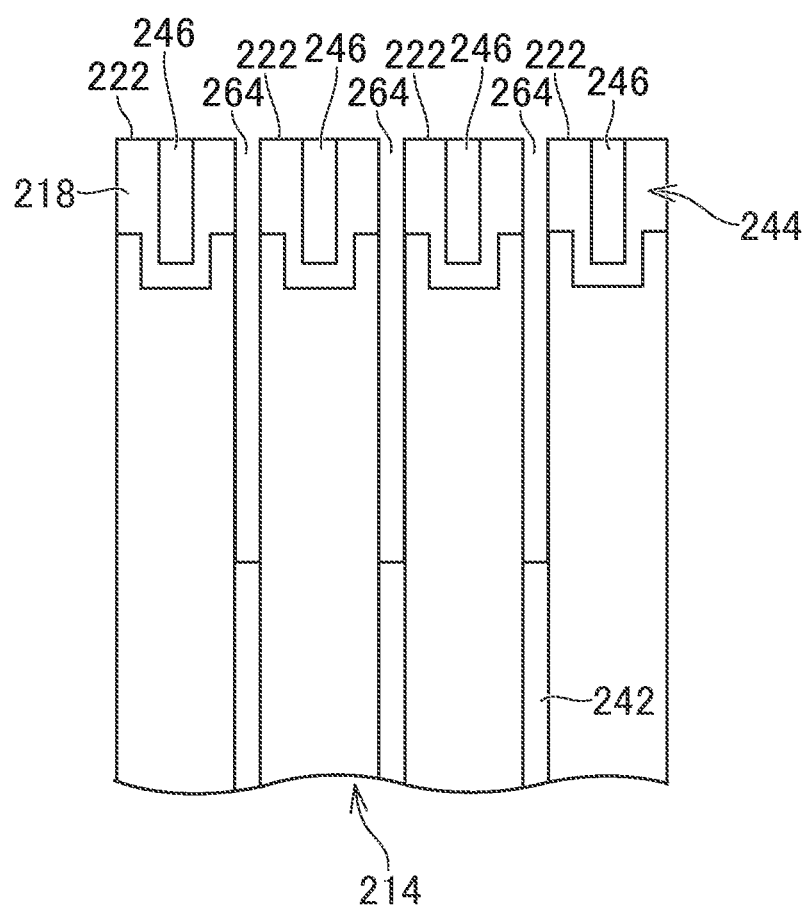
FIG. 8 is a plan view of a second surface of the flexible printed circuit board in the second embodiment.

FIG. 7 is a plan view of a first surface of a flexible printed circuit board in a second embodiment. FIG. 8 is a plan view of a second surface of the flexible printed circuit board in the second embodiment. The insulating substrate 218 has some projections 222, and a slit 264 between the adjacent projections 222. This reduces the heat capacity of the flexible printed circuit board 214 (insulating substrate 218), even improves the visibility of the connection portion by the conductive connecting material 62, and improves the robustness as well. On the first surface 228, the first wiring pattern 230 includes some pairs (e.g., four pairs) of ground pads 238 and includes some signal wires 232. On the second surface 242, the second wiring pattern 244 includes some signal pads 246. The pitch between adjacent signal pads 246 is 1.5 mm or more. The contents described in the first embodiment are applicable to the present embodiment.

Figure 9:
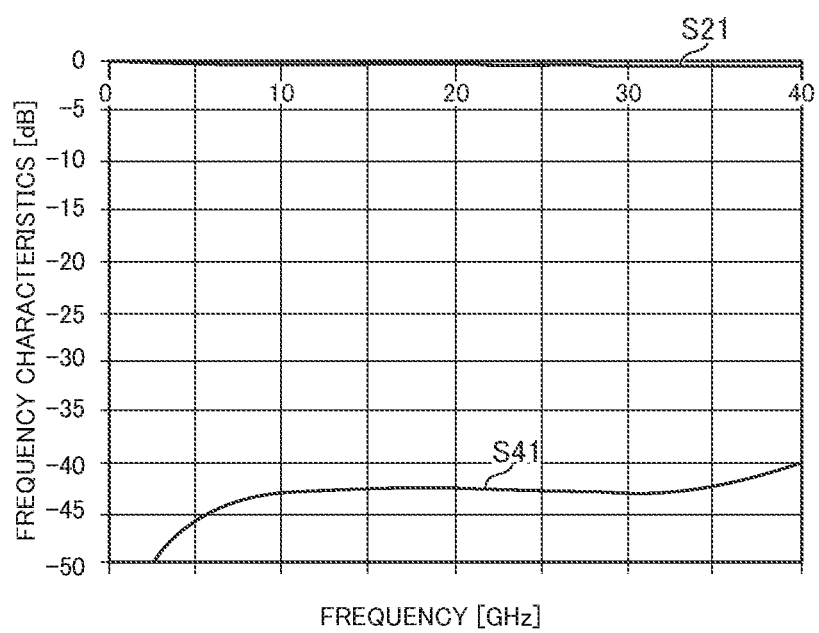
FIG. 9 is a diagram of frequency characteristics, in a conventional example and the second embodiment, obtained by simulation using the three-dimensional electric field analysis tool.

FIG. 9 is a diagram of frequency characteristics, in a conventional example and the second embodiment, obtained by simulation using the three-dimensional electric field analysis tool. S21 shows the transmission coefficient from the input terminal to the output terminal, of the same line. S41 shows the transmission coefficient (i.e. crosstalk) from the input terminal to the output terminal, of the adjacent lines. From the simulation results, the crosstalk is apparently low in the second embodiment.

While there have been described what are at present considered to be certain embodiments, it will be understood that various modifications may be made thereto, and it is intended that the appended claims cover all such modifications as fall within the true spirit and scope of the invention.

What is claimed is:

1. An optical module comprising:
a photoelectric device adapted to convert an optical signal and an electrical signal at least from one to another; and
a flexible printed circuit board electrically connected to the photoelectric device,
wherein
the flexible printed circuit board includes an insulating substrate with a first surface and a second surface, a first wiring pattern on the first surface, and a second wiring pattern on the second surface,
the first wiring pattern includes a signal line with a signal terminal portion at a tip and a signal-line portion narrower than the signal terminal portion, the first wiring pattern including a pair of ground pads at positions sandwiching the signal-line portion, at least part of the pair of ground pads avoiding being adjacent to the signal terminal portion, at least part of the signal terminal portion avoiding being adjacent to either of the pair of ground pads in an arranging direction of the signal terminal portion and the pair of ground pads, and
the second wiring pattern includes a ground plane overlapping with the signal-line portion and being connected to the pair of ground pads, the second wiring pattern including a signal pad connected to the signal terminal portion.

2. The optical module according to claim 1, wherein
the insulating substrate, in a planar shape, has a first side extending in a first direction, and a pair of second sides extending from respective both ends of the first side and extending in a second direction intersecting with the first direction,
the signal terminal portion is at an end portion including the first side,
the pair of ground pads are at respective end portions including the pair of second sides.

3. The optical module according to claim 2, wherein
the signal terminal portion has an edge that coincides with the first side, and
the pair of ground pads have edges that coincide with the respective pair of second sides.

4. The optical module according to claim 2, wherein
the insulating substrate, in the planar shape, has a main body and at least one projection from the main body, and
the at least one projection has an outer shape composed of the first side and the pair of second sides.

5. The optical module according to claim 4, wherein the at least one projection includes plural projections, and
the insulating substrate has a slit between each adjacent pair of the projections.

6. The optical module according to claim 1, further comprising a printed circuit board with a circuit pattern connected to the ground plane and the signal pad with a conductive connecting material.

7. An optical module comprising:
a photoelectric device adapted to convert an optical signal and an electrical signal at least from one to another; and
a flexible printed circuit board electrically connected to the photoelectric device,
wherein
the flexible printed circuit board includes an insulating substrate with a first surface and a second surface, a first wiring pattern on the first surface, and a second wiring pattern on the second surface,
the first wiring pattern includes a signal line with a signal terminal portion at a tip and a signal-line portion narrower than the signal terminal portion, the first wiring pattern including a pair of ground pads at positions sandwiching the signal-line portion, at least part of the pair of ground pads avoiding being adjacent to the signal terminal portion,
the second wiring pattern includes a ground plane overlapping with the signal-line portion and being connected to the pair of ground pads, the second wiring pattern including a signal pad connected to the signal terminal portion,
the insulating substrate, in a planar shape, has a first side extending in a first direction, and a pair of second sides extending from respective both ends of the first side and extending in a second direction intersecting with the first direction,
the signal terminal portion is at an end portion including the first side,
the pair of ground pads are at respective end portions including the pair of second sides,
the insulating substrate, in a planar shape, has a main body and at least one projection from the main body,
the at least one projection has an outer shape composed of the first side and the pair of second sides,
the first wiring pattern further includes a power supply line, and
the second wiring pattern further includes a power supply pad connected to the power supply line.

8. The optical module according to claim 7, wherein the power supply line is positioned without being adjacent to the pair of ground pads in the first direction.

9. The optical module according to claim 8, wherein the power supply line is on the main body without being on the at least one projection.

* * * * *